(12) United States Patent
Rhodes et al.

(10) Patent No.: US 7,514,715 B2
(45) Date of Patent: Apr. 7, 2009

(54) ANGLED IMPLANT FOR TRENCH ISOLATION

(75) Inventors: Howard Rhodes, Boise, ID (US); Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 10/923,943

(22) Filed: Aug. 24, 2004

(65) Prior Publication Data

US 2005/0179071 A1 Aug. 18, 2005

Related U.S. Application Data

(62) Division of application No. 10/385,844, filed on Mar. 12, 2003, now Pat. No. 6,949,445.

(51) Int. Cl.
*H01L 29/04* (2006.01)
*H01L 21/8238* (2006.01)

(52) U.S. Cl. .................. 257/72; 257/215; 257/292; 257/E27.13; 438/221; 438/359; 438/424

(58) Field of Classification Search .......... 438/221, 438/359, 424, 427, 75; 257/E21.54, 72, 215, 257/292, 233, E27.13, E27.133
See application file for complete search history.

(56) References Cited

U.S. PATENT DOCUMENTS

| | | | |
|---|---|---|---|
| 5,291,049 A | 3/1994 | Morita | |
| 5,728,621 A * | 3/1998 | Zheng et al. | 438/427 |
| 5,801,082 A | 9/1998 | Tseng | |
| 5,909,041 A * | 6/1999 | Hosier et al. | 257/292 |
| 5,960,276 A | 9/1999 | Liaw et al. | |
| 6,146,971 A * | 11/2000 | Chen et al. | 438/424 |
| 6,218,691 B1 | 4/2001 | Chung et al. | |
| 6,326,655 B1 | 12/2001 | Suzuki | |
| 6,392,263 B1 * | 5/2002 | Chen et al. | 257/292 |
| 6,423,993 B1 | 7/2002 | Suzuki et al. | |
| 6,656,783 B2 * | 12/2003 | Park | 438/221 |
| 6,744,084 B2 * | 6/2004 | Fossum | 257/292 |
| 6,888,214 B2 * | 5/2005 | Mouli et al. | 257/510 |
| 6,946,635 B1 * | 9/2005 | Pine | 250/208.1 |
| 7,087,944 B2 * | 8/2006 | Rhodes et al. | 257/292 |
| 2001/0017382 A1 * | 8/2001 | Rhodes et al. | 257/233 |
| 2001/0050382 A1 | 12/2001 | Rhodes et al. | |
| 2002/0086495 A1 * | 7/2002 | Yoo et al. | 438/423 |
| 2002/0115270 A1 * | 8/2002 | Wu | 438/484 |
| 2002/0171097 A1 | 11/2002 | Chen et al. | |
| 2002/0197782 A1 | 12/2002 | Kitamura | |
| 2003/0030076 A1 * | 2/2003 | Park | 257/207 |
| 2005/0009855 A1 * | 1/2005 | Yoakim et al. | 514/278 |

FOREIGN PATENT DOCUMENTS

EP 1 028 470 A2 8/2000
WO WO 99/25018 5/1999

* cited by examiner

*Primary Examiner*—Hsien-ming Lee
(74) *Attorney, Agent, or Firm*—Dickstein Shapiro LLP

(57) ABSTRACT

A trench isolation having a sidewall and bottom implanted region located within a substrate of a first conductivity type is disclosed. The sidewall and bottom implanted region is formed by an angled implant, a 90 degree implant, or a combination of an angled implant and a 90 degree implant, of dopants of the first conductivity type. The sidewall and bottom implanted region located adjacent the trench isolation reduces surface leakage and dark current.

14 Claims, 7 Drawing Sheets

ANGLED IMPLANT FOR TRENCH ISOLATION

CROSS REFERENCE TO RELATED APPLICATIONS

The present application is a divisional of U.S. application Ser. No. 10/385,844, filed Mar. 12, 2003, now U.S. Pat. No. 6,949,445, issued on Sep. 27, 2005, the disclosure of which is herewith incorporated by reference in its entirety.

FIELD OF THE INVENTION

The present invention relates to the field of semiconductor devices and, in particular, to improved isolation devices for high quantum efficiency imagers.

BACKGROUND OF THE INVENTION

CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode, photogate or photoconductor having a sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transference.

In a conventional CMOS imager, the active elements of a pixel cell perform the necessary functions of: (1) photon to charge conversion; (2) accumulation of image charge; (3) transfer of charge to the floating diffusion node; (4) resetting the floating diffusion node to a known state before the transfer of charge to it; (5) selection of a pixel for readout; and (6) output and amplification of a signal representing pixel charge. The charge at the floating diffusion node is converted to a pixel output voltage by the source follower output transistor. The photosensitive element of a CMOS imager pixel is typically either a depleted p-n junction photodiode or a field induced depletion region beneath a photogate.

CMOS imaging circuits of the type discussed above are generally known and discussed in, for example, Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994), the disclosures of which are incorporated by reference herein.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned diode 11 (FIG. 2). The pinned photodiode is termed "pinned" because the potential in the photodiode is pinned to a constant value when the photodiode is fully depleted. It should be understood, however, that the CMOS sensor pixel cell 10 may include a photogate, photoconductor, buried photodiode, or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

A cross-sectional view of the exemplary CMOS image sensor 10 of FIG. 1 taken along line 2-2' is illustrated in FIG. 2. The charge accumulating region 21 is formed as a pinned photodiode 11 which has a photosensitive or p-n-p junction region formed by a p-type layer 24, an n-type region 26 and the p-type substrate 20. The pinned photodiode 11 includes two p-type regions 20, 24 so that the n-type photodiode region 26 is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferable n-type.

Generally, in CMOS image sensors such as the CMOS image sensor cell 10 of FIGS. 1-2, incident light causes electrons to collect in region 26. A maximum output signal, which is produced by the source follower transistor having gate 50, is proportional to the number of electrons to be extracted from the region 26. The maximum output signal increases with increased electron capacitance or acceptability of the region 26 to acquire electrons. The electron capacity of pinned photodiodes typically depends on the doping level of the image sensor and the dopants implanted into the active layer.

FIG. 2 also illustrates trench isolation regions 15 formed in the active layer 20 adjacent the charge accumulating region 21. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Trench isolation regions 15 are typically formed by etching trenches into the substrate 10 to provide a physical barrier between adjacent pixels and. to isolate pixels from one another. The trenches are etched by employing a dry anisotropic or other etching process and then are filled with a dielectric such as a chemical vapor deposited (CVD) silicon dioxide ($SiO_2$). The filled trenches are then planarized by an etch-back process so that the dielectric remains only in the trenches and their top surface remains level with that of the silicon substrate. The planarized dielectric may be above the silicon substrate.

A common problem associated with the formation of the above-described trench isolation regions 15 is that, when ions are implanted in the substrate close to edges or sidewalls 16 (FIG. 2) of the trench, current leakage can occur at the junction between the active device regions and the trench. In addition, the dominant crystallographic planes along the sidewalls 16 of the trench isolation regions 15 have a higher silicon density than the adjacent silicon substrate and, therefore, create a high density of trap sites along the trench sidewalls 16. These trap sites are normally uncharged but become charged when electrons and holes become trapped in the trap sites. These trapped carriers add an electrical charge to the device, thus contributing to the fixed charge of the device and changing the threshold voltage of the device. As a result of these trap sites formed along the sidewalls 16 of the trench isolation regions 15, current generation near and along the trench sidewalls 16 can be very high. Current generated from trap sites inside or near the photodiode depletion region causes dark current.

Minimizing dark current in the photodiode is important in CMOS image sensor fabrication. Dark current is generally attributed to leakage in the charge collection region 21 of the pinned photodiode 11, which is strongly dependent on the doping implantation conditions of the CMOS image sensor. In addition and as explained above, defects and trap sites inside or near the photodiode depletion region strongly influence the magnitude of dark current generated. In sum, dark current is a result of current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

CMOS imagers also typically suffer from poor signal to noise ratios and poor dynamic range as a result of the inability to fully collect and store the electric charge collected in the region 26. Since the size of the pixel electrical signal is very small due to the collection of photons in the photo array, the signal to noise ratio and dynamic range of the pixel should be as high as possible.

There is needed, therefore, an improved active pixel photosensor for use in a CMOS imager that exhibits reduced dark current and increased photodiode capacitance. There is also needed a trench isolation region that (i) prevents current generation or current leakage and (ii) acts as a link up region between the pinned surface layer and the bulk substrate. A method of fabricating an active pixel photosensor exhibiting these improvements is also needed, as well as an isolation technique that reduces dark current and minimizes current leakage in a pinned photodiode of a pixel sensor cell.

BRIEF SUMMARY OF THE INVENTION

In one aspect, the invention provides a trench isolation having a sidewall and bottom implanted region of a first conductivity type located within a substrate of the first conductivity type. The sidewalls and bottom implanted region is formed by either (i) an angled implant; (ii) a 90 degree implant; or (iii) a combination of both an angled and a 90 degree implant of dopants of the first conductivity type in a trench isolation region. The trench isolation with the sidewalls and bottom implanted region may be provided to isolate an IC electrical device or circuit from another IC electrical device or circuit, and may be used in CMOS imagers, CCDs, ASIC and DSP devices, and other integrated circuits structures and devices.

In another aspect, the invention provides a photodiode with a pinned layer of a first conductivity type linked to a substrate of the first conductivity type by a sidewall and bottom implanted region of a trench isolation region. The sidewall and bottom implanted region is formed by either (i) an angled implant; (ii) a 90 degree implant; or (iii) a combination of both an angled and 90 degree implant of dopants of the first conductivity type in a trench isolation region. The sidewall and bottom implanted region located on the sidewalls and bottom of the trench isolation region reduces surface leakage and dark current, and further increases the capacitance of the pinned photodiode.

In yet another aspect, the invention provides a method of forming a sidewall and bottom implanted region to link up an electrical device, for such as a pinned surface layer of a pinned photodiode, to a substrate. In one embodiment, the sidewall and bottom implanted region may be formed by implanting desired dopants at angles other than 90 degrees in a trench isolation region. In another embodiment, the sidewall and bottom implanted region may be formed by implanting desired dopants at both a 90 degree angle and at angles other than 90 degrees in a trench isolation region. In yet another embodiment, the sidewall and bottom implanted region may be formed by implanting desired dopants at a 90 degree angle.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Figure 8:
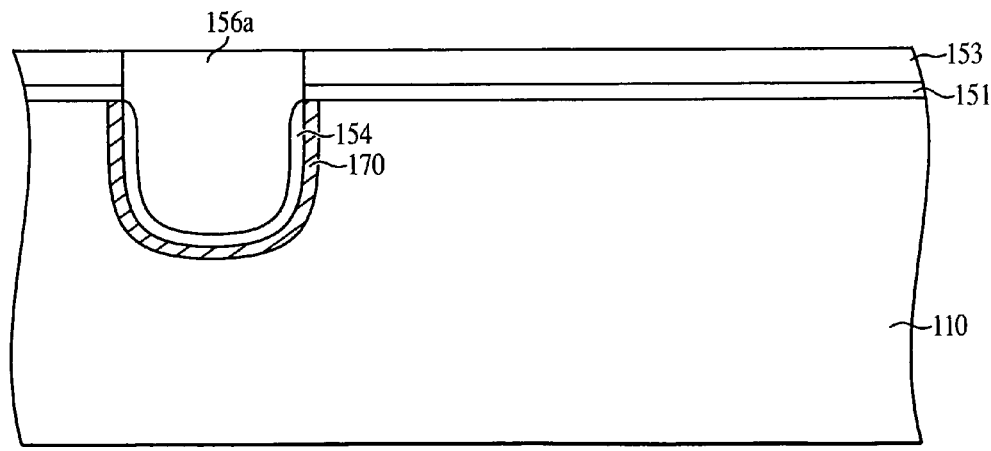
FIG. 8 is a schematic cross-sectional view of a CMOS image sensor pixel of FIG. 3 at a stage of processing subsequent to that shown in FIG. 7.
Figure 9:
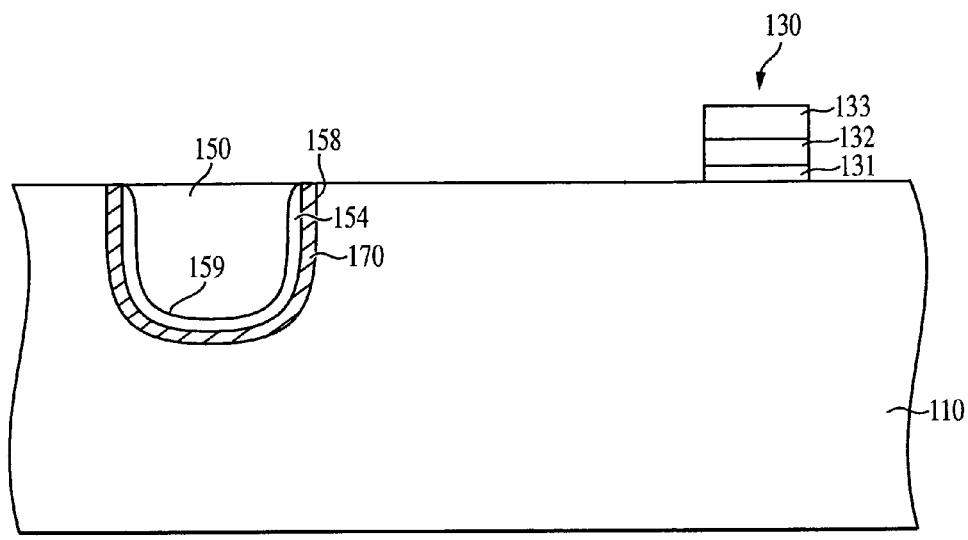
FIG. 9 is a schematic cross-sectional view of a CMOS image sensor pixel of FIG. 3 at a stage of processing subsequent to that shown in FIG. 8.
Figure 10:
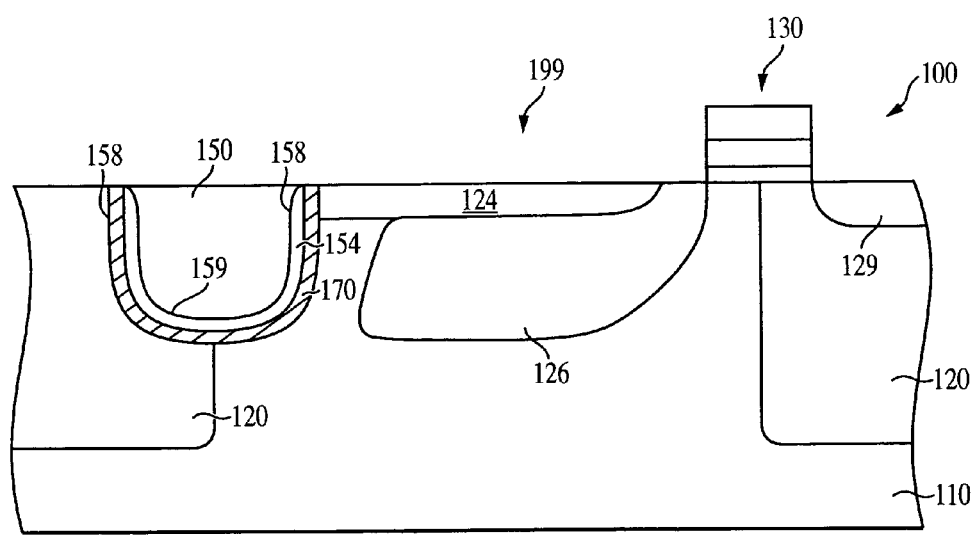
FIG. 10 is a schematic cross-sectional view of a CMOS image sensor pixel of FIG. 3 at a stage of processing subsequent to that shown in FIG. 9.

Referring now to the drawings, where like elements are designated by like reference numerals, FIGS. 3-10 illustrate a first exemplary embodiment of a method of forming a four-transistor (4T) pixel sensor cell 100 (FIG. 10) having a pinned photodiode 199 (FIG. 10) with a sidewall implanted region 170 (FIG. 10) of a trench isolation region 150. As explained in detail below, the sidewall implanted region 170 is formed by an angled implant and acts as a link up region between the pinned surface layer 124 (FIG. 10) and the bulk substrate 110. The STI sidewall implanted region 170 also suppresses leakage and dark current along sidewalls 158 and bottom 159 of trench isolation regions 150 (FIG. 10).

It should be noted that, although the invention will be described below in connection with a four-transistor (4T) pixel cell, the invention also has applicability to a three-transistor (3T) cell or a five-transistor (5T) cell. A 3T cell differs from the 4T cell by the omission of the charge transfer transistor and associated gate, and the coupling of the n regions of the photodiode and the floating diffusion regions through an overlap of the two or an n region bridging the two, which is well known in the art. A 5T cell differs from the 4T cell by the addition of a shutter transistor or a CMOS photogate transistor.

In addition, although the invention will be described below with reference to the formation of a trench isolation region as part of a 4T pixel cell in a CMOS imager, the invention is not limited to CMOS imagers and has applicability to isolation regions which provide isolation for any electrical device and circuit. Thus, the invention also contemplates a trench isolation with the sidewalls and bottom implanted region that isolates an integrated circuit electrical device or circuit from another integrated circuit electrical device or circuit. For example, the invention contemplates an implanted trench isolation region which may be used in CMOS imagers, CCDs, ASIC and DSP devices, and memory devices such as DRAM, SRAM, FLASH, and many other integrated circuits structures and devices.

Although FIGS. 3-10 illustrate only a portion of the substrate 110 with only one trench 152, it must be understood that the present invention contemplates the simultaneous formation of a plurality of trench isolation features at various locations on the substrate 110. In addition, although the invention will be described below with reference to the formation of a trench isolation region by a Shallow Trench Isolation (STI) method, the invention has equal applicability to isolation devices formed by a LOCOS (LOCal Oxidation of Silicon) process, or a combination of such processes.

Figure 2:
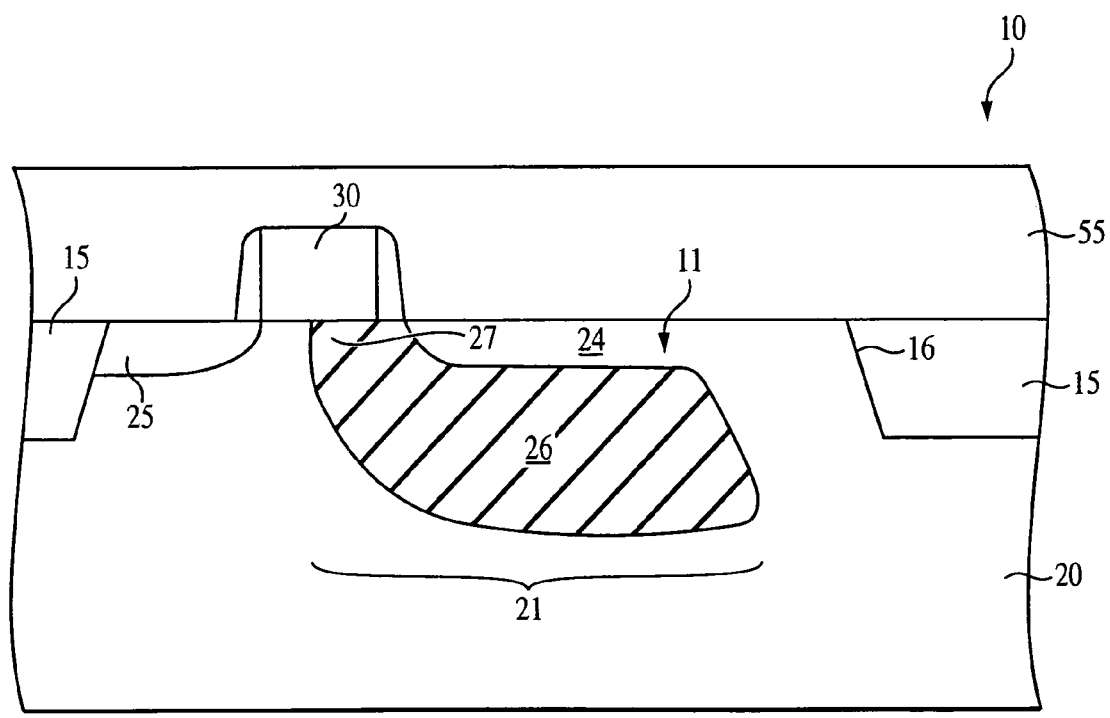
FIG. 2 is a schematic cross-sectional view of the CMOS image sensor of FIG. 1 taken along line 2-2'.
Figure 3:
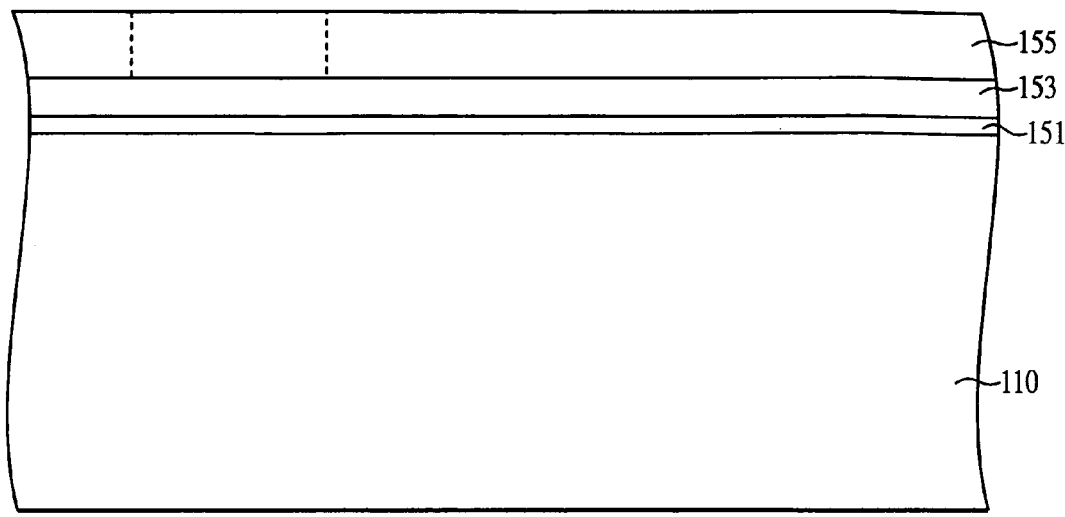
FIG. 3 is a schematic cross-sectional view of a CMOS image sensor pixel illustrating the fabrication of a pinned photodiode in accordance with the present invention and at an initial stage of processing.
Figure 4:
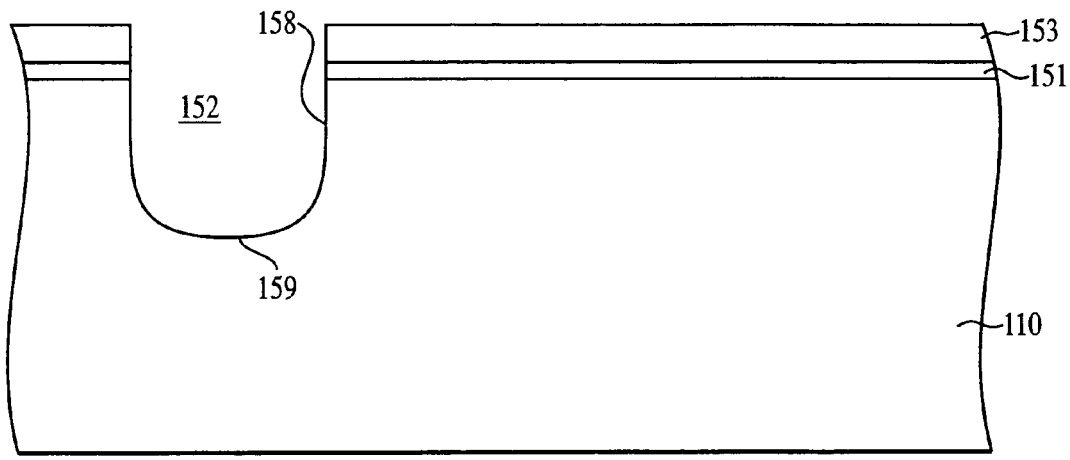
FIG. 4 is a schematic cross-sectional view of a CMOS image sensor fragment of FIG. 3 at a stage of processing subsequent to that shown in FIG. 3.

FIG. 3 illustrates a substrate 110 along a cross-sectional view which is the same view as in FIG. 2. For exemplary purposes, the substrate 110 is a silicon substrate. However, as noted above, the invention has equal application to other semiconductor substrates. FIG. 3 also illustrates a pad oxide layer 151 and a blanket layer 153 of a hard mask material such as silicon nitride or silicon oxide material, which is formed over the pad oxide layer 151. A photoresist layer 155 (FIG. 3) is formed over the hard mask layer 153 and then patterned with a mask (not shown) and anisotropically etched to obtain a trench 152, as illustrated in FIG. 4. The trench 152 has a depth of about 1,000 to about 4,000 Angstroms, more preferably of about 2,000 Angstroms, and a width of about 500 to about 5,000 Angstroms, more preferably of about 3,000 Angstroms.

Figure 5:
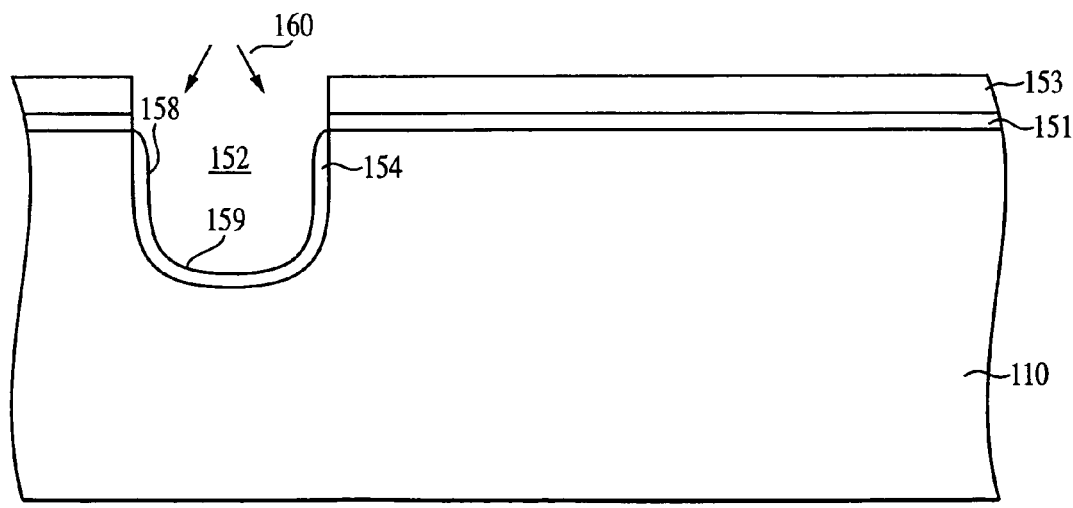
FIG. 5 is a schematic cross-sectional view of a CMOS image sensor pixel of FIG. 3 at a stage of processing subsequent to that shown in FIG. 4.

If desired, a thin insulating layer 154 of about 10 to about 400 Angstroms is formed on sidewalls 158 (FIG. 4) and bottom 159 (FIG. 4) of the trench 152, as shown in FIG. 5. The thin insulating layer 154 may be formed of an oxide, silicon nitride, or an oxide/silicon nitride for example, to aid in smoothing out the corners in the bottom of the trench 152 and to reduce the amount of stress in the dielectric material used to later fill in the trenches. Although the embodiments of the present invention will be described below with reference to a trench isolation structure comprising a thin insulating layer, such as the thin insulating layer 154 formed on its sidewalls and bottom, the invention is not limited to these embodiments. Accordingly, the invention also contemplates the formation of trench isolation structures which do not comprise a thin insulating layer.

Figure 6:
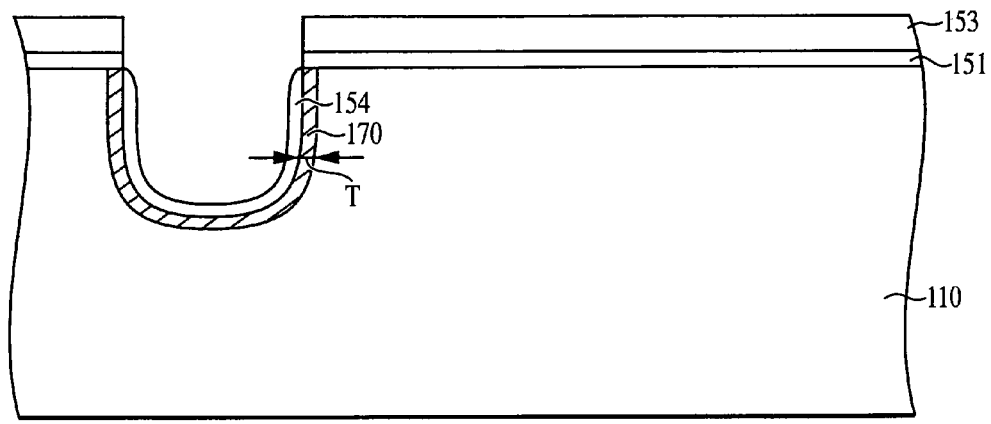
FIG. 6 is a schematic cross-sectional view of a CMOS image sensor pixel of FIG. 3 at a stage of processing subsequent to that shown in FIG. 5.

Next, the structure of FIG. 5 is subjected to an angled dopant 160 (FIG. 5) with a dopant of the first conductivity type, which for exemplary purposes is p-type. This way, p-type ions are implanted through the isolation trench 152 (FIG. 5) to form a p-type sidewall and bottom implanted region 170, as illustrated in FIG. 6. The p-type sidewall and bottom implanted region 170 is formed on the sidewalls 158 and bottom 159 of the trench 152 and in contact with the thin insulating layer 154.

For the purposes of the present invention, the term "angled implantation" is defined as implantation conducted at incidence angles with the substrate 110 other than a right angle, that is at angles other than 90 degrees. Thus, the term "angled implantation" refers to implantation conducted at incidence angles with the substrate between 0 degrees to less than 90 degrees, more preferably between 10 to about 30 degrees.

Referring back to FIG. 5, the angled dopant implantation 160 is conducted to implant p-type ions, such as boron, beryllium, indium or magnesium, into an area of the substrate 110 located right below the shallow trench 152 and to form the p-type sidewall and bottom implanted region 170 (FIG. 6). The thickness T (FIG. 6) of the p-type sidewall and bottom implanted region 170 may be about 10 to about 1,500 Angstroms, more preferably of about 300 Angstroms.

The angled ion implantation 160 may be conducted by placing the substrate 110 in an ion implanter and implanting appropriate p-type dopant ions through the shallow trench 152 (FIG. 5) into the substrate 110 at an energy of 1 keV to about 50 keV, more preferably of about 10 keV, to form p-type sidewall implanted region 170. P-type dopants, such as boron, beryllium, indium or magnesium, may be employed for the angled implant. The implant dose in the p-type sidewall and bottom implanted region 170 (FIG. 6) is within the range of about $3 \times 10^{11}$ to about $3 \times 10^{13}$ atoms per cm$^2$, more preferably of about $1 \times 10^{12}$ atoms per cm$^2$. If desired, multiple implants may be used to tailor the profile of the p-type sidewall implanted region 170.

Figure 7:
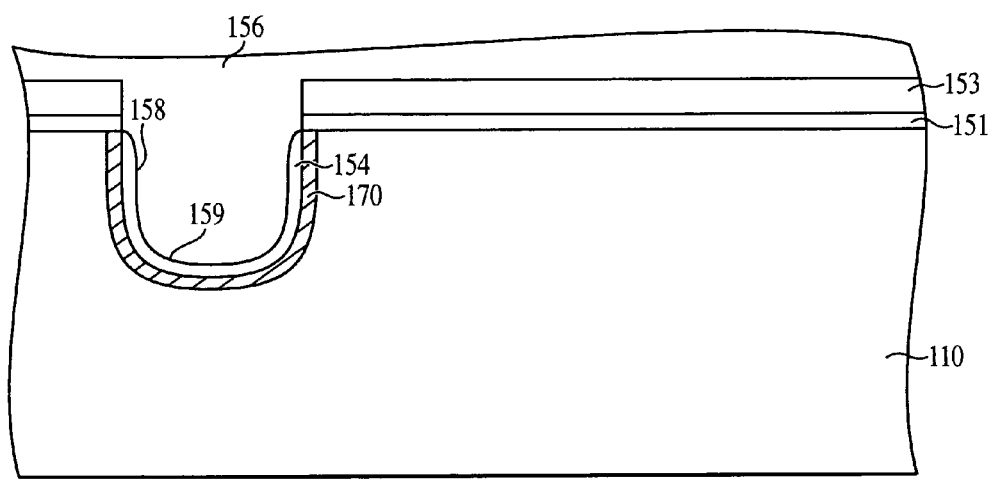
FIG. 7 is a schematic cross-sectional view of a CMOS image sensor pixel of FIG. 3 at a stage of processing subsequent to that shown in FIG. 6.

Subsequent to the formation of the sidewall and bottom implanted region 170 (FIG. 6), a dielectric material 156 is blanket deposited over the structure of FIG. 6 to fill in the trench 152, as illustrated in FIG. 7. The dielectric material 156 may be an oxide material, for example a silicon oxide such as SiO or SiO$_2$, oxynitride, a nitride material such as silicon nitride, silicon carbide, a high temperature polymer, or other suitable dielectric materials. In a preferred embodiment, however, the dielectric material 156 is a high density plasma (HDP) oxide, a material which has a high ability to effectively fill narrow trenches. Thus, reference to the dielectric material 156 will be made in this application as to the HDP oxide 156.

Subsequent to the formation of the HDP oxide 156, the HDP oxide 156 is planarized down to or near the planar surface of the hard mask layer 153 to form a plug or filler 156a, as shown in FIG. 8. In a preferred embodiment, the HDP oxide 156 is planarized by means of chemical mechanical polishing (CMP) or a well-known RIE dry etching process. In a chemical mechanical polishing, an abrasive polish is used to remove the top surface of the HDP oxide 156 down to or near the planar surface of the hard mask layer 153. This way, the top surfaces of hard mask layer 153 and the plug 156a are uniform across the entire surface of the substrate, as illustrated in FIG. 8.

The hard mask layer 153 is then removed by conventional techniques, such as selective dry etch or a wet etch using, for example, phosphoric acid (H$_3$PO$_4$). If desired, subsequent wet etches may be employed to round the top edges of the oxide.

FIG. 9 also illustrates a multi-layered transfer gate stack 130 formed over the silicon substrate 110. The transfer gate stack 130 comprises a first gate oxide layer 131 of grown or deposited silicon oxide on the silicon substrate 110, a conductive layer 132 of doped polysilicon or other suitable material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

If desired, a silicide layer (not shown) may be also formed in the multi-layered gate stack 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or WN$_x$/W or it could be entirely formed of WN$_x$.

A second masked dopant implantation is conducted with a dopant of the first conductivity type, which for exemplary purposes is p-type, to implant ions in predefined areas of the substrate 110 to form a p-type doped layer or well 120, as illustrated in FIG. 9. Although the embodiment of the present invention has been described with reference to the formation of the p-type doped layer 120 subsequent to the formation of the trench isolation 150 and of the gate stack 130, it must be understood that the present invention also contemplates the formation of the p-type doped layer 120 prior to the formation of the trench isolation 150.

A third dopant implantation using a dopant of a second conductivity type, which for exemplary purposes is n-type, is conducted to implant ions in the area of the substrate directly beneath the active area of the pixel cell and to form an n-type region 126, as illustrated in FIG. 10. The implanted n-doped region 126 forms a photosensitive charge storage region for collecting photogenerated electrons. Ion implantation may be conducted by placing the substrate 110 in an ion implanter, and implanting appropriate n-type dopant ions into the substrate 110 at an energy of 10 keV to 1 MeV to form n-doped region 126. N-type dopants such as arsenic, antimony, or phosphorous may be employed. The implant dose in the n-doped region 126 (FIG. 10) is within the range of about $1 \times 10^{11}$ to about $1 \times 10^{16}$ atoms per cm$^2$, and is preferably within the range of about $1 \times 10^{12}$ to about $3 \times 10^{13}$ atoms per cm$^2$. If desired, multiple implants may be also used to tailor the profile of the n-doped region 126. The third dopant implantation may be also conducted to form n-doped region 129 (FIG. 10) located adjacent the gate stack 130 and on the opposite side of the n-type region 126.

Next, a fourth dopant implantation with a dopant of the first conductivity type, which for exemplary purposes is p-type, is conducted so that p-type ions are implanted into the area of the substrate over the implanted n-type region 126 and between the transfer gate 130 and field oxide region 155 to form a p-type pinned surface layer 124 of the now completed photodiode 199 (FIG. 10) formed by regions 124, 110 and 126. As shown in FIG. 10, the p-type region 124 is linked to the p-type region 120 and substrate 110 by the p-type sidewall implanted region 170 formed by angled implantation along the sidewalls 158 and the bottom 159 of the shallow trench isolation 150. This way, the overall capacitance of the photodiode 199 is increased and the charge collection performance of the photodiode 199 is improved.

In addition to providing a link up or a hook up region for the p-type region 124, the p-type sidewall implanted region 170 also minimizes the formation of trap sites along the sidewalls 158 and bottom 159 which become charged when electrons and holes become trapped in the trap sites and consequently affect the threshold voltage of the photodiode 199. As a result of minimizing the formation of these trap sites along the sidewalls 158 and bottom 159 of the trench isolation regions 150, dark current generation and leakage near and along the trench sidewalls 158 and bottom 159 is decreased.

Figure 11:
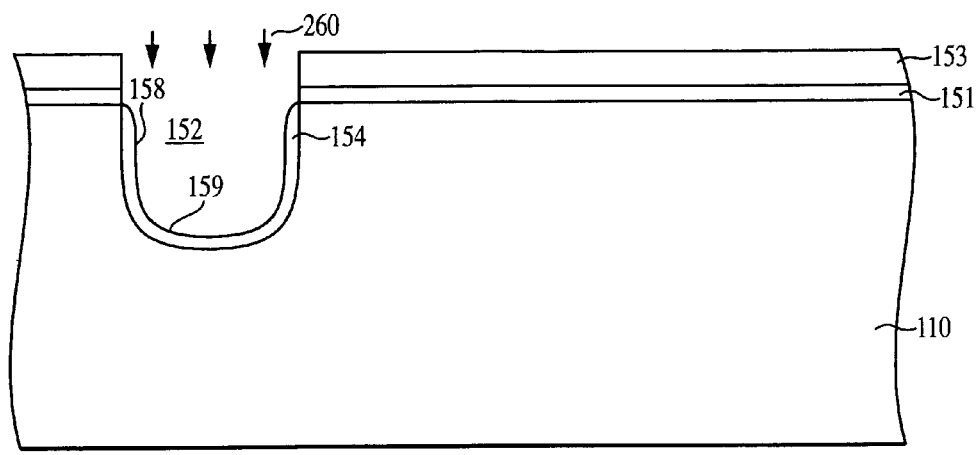
FIG. 11 is a schematic cross-sectional view of a CMOS image sensor pixel of FIG. 3 at a stage of processing subsequent to that shown in FIG. 4 and in accordance with a second embodiment of the invention.
Figure 12:
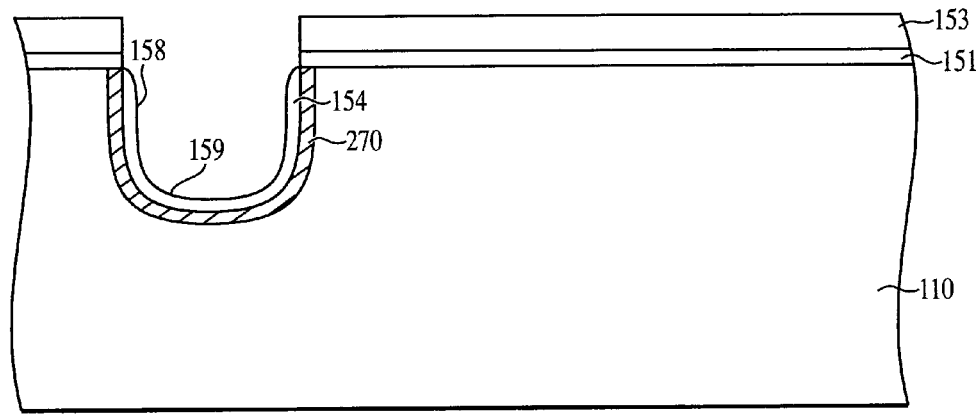
FIG. 12 is a schematic cross-sectional view of a CMOS image sensor pixel of FIG. 3 at a stage of processing subsequent to that shown in FIG. 11.
Figure 13:
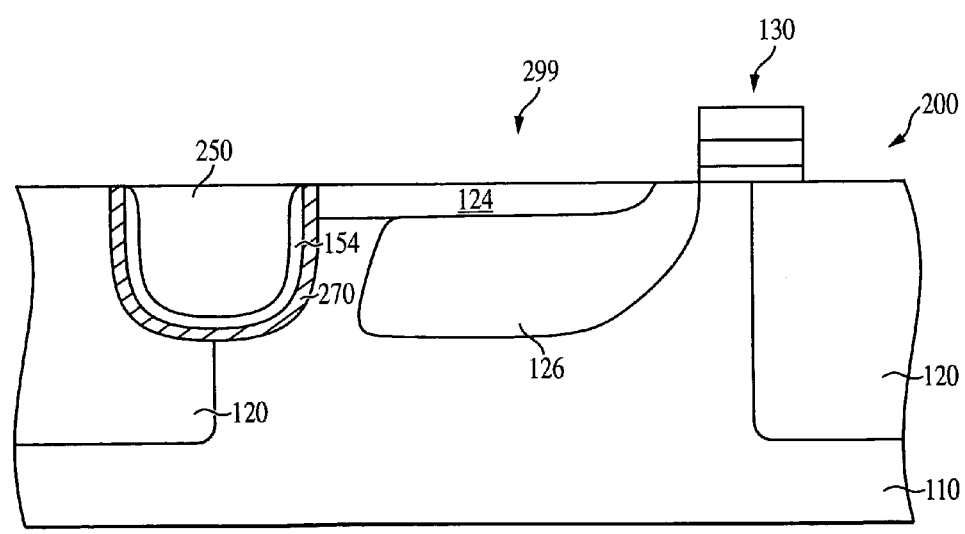
FIG. 13 is a schematic cross-sectional view of a CMOS image sensor pixel of FIG. 3 at a stage of processing subsequent to that shown in FIG. 12.

FIGS. 11-13 illustrate yet another embodiment of the present invention according to which p-type sidewall and bottom implanted region 270 is formed by conducting a 90 degree angle implant 260 (FIG. 11) as part of the fabrication of a photodiode 299 (FIG. 13) of a pixel sensor cell 200 (FIG. 13). FIG. 11 corresponds to the structure described above leading to FIG. 5. FIG. 11 differs from FIG. 5, however, in that FIG. 11 shows a 90 degree implant in lieu of the angled implant of FIG. 5.

For the purposes of the present invention, the term "90 degree implantation" is defined as implantation conducted at incidence angles with the substrate 110 of about 90 degrees, but which is angled with respect to the sloped sidewalls 158 of the trench 152.

The 90 degree implantation 260 of FIG. 11 may be conducted by placing the substrate 110 in an ion implanter and implanting appropriate p-type dopant ions through the trench 152 into the substrate 110 at an energy of 1 keV to about 50 keV, more preferably of about 10 keV, to form p-type sidewall and bottom implanted region 270. P-type dopants, such as boron, beryllium, indium or magnesium, may be employed for the straight implant. The implant dose in the p-type sidewall and bottom implanted region 270 (FIG. 12) is within the range of about $3 \times 10^{11}$ to about $3 \times 10^{13}$ atoms per $cm^2$, more preferably of about $1 \times 10^{12}$ atoms per $cm^2$. If desired, multiple implants may be used to tailor the profile of the p-type sidewall and bottom implanted region 270.

As in the previous embodiment, the p-type sidewall and bottom implanted region 270 is formed adjacent the thin insulating layer 154 of the trench isolation 250 (FIG. 13) filled with an oxide material, as shown in FIGS. 12-13. The sidewall and bottom implanted region 270 provides a link up or a hook up region for the p-type region 124 to the p-type layer 120 and substrate 110 and also minimizes the formation of trap sites along the sidewalls 160. As a result of minimizing the formation of these trap sites along the sidewalls 158 and bottom 159 of the trench isolation regions 250, dark current generation and leakage near and along the trench sidewalls 158 and bottom 159 is decreased.

Figure 14:
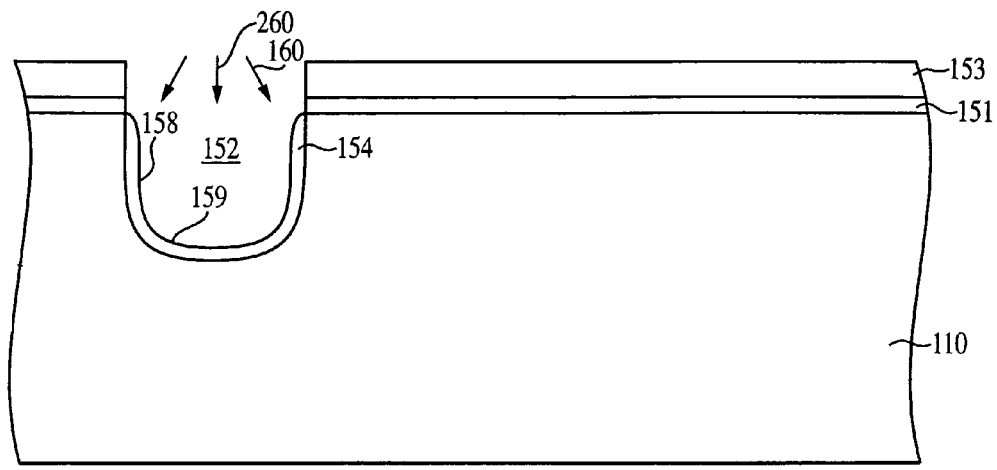
FIG. 14 is a schematic cross-sectional view of a CMOS image sensor pixel of FIG. 3 at a stage of processing subsequent to that shown in FIG. 4 and in accordance with a third embodiment of the invention.
Figure 15:
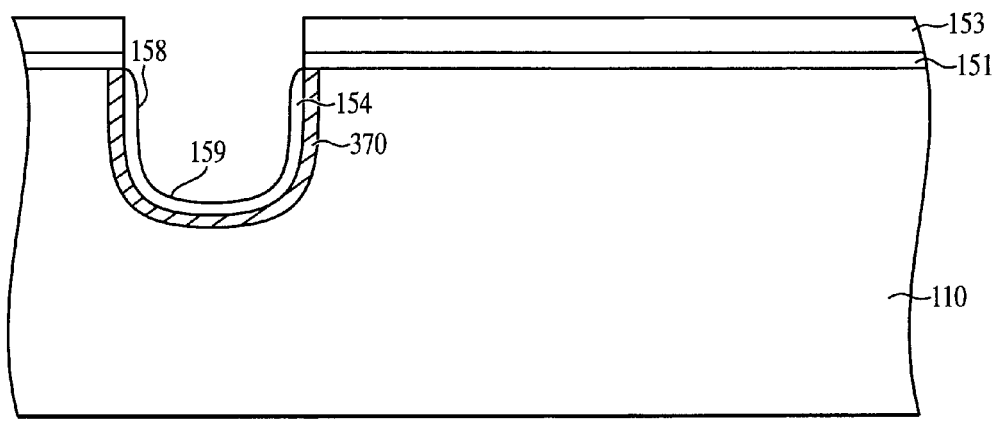
FIG. 15 is a schematic cross-sectional view of a CMOS image sensor pixel of FIG. 3 at a stage of processing subsequent to that shown in FIG. 14.
Figure 16:
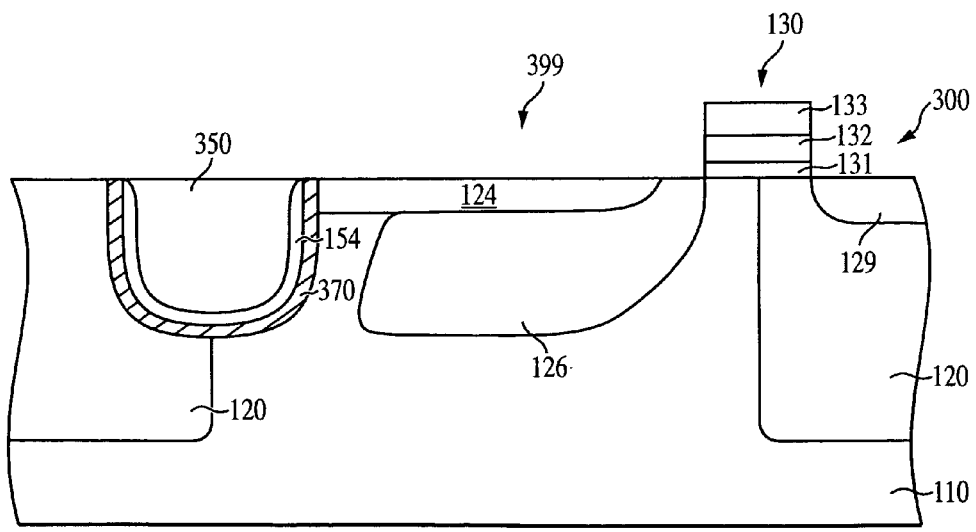
FIG. 16 is a schematic cross-sectional view of a CMOS image sensor pixel of FIG. 3 at a stage of processing subsequent to that shown in FIG. 15.

FIGS. 14-16 illustrate yet another embodiment of the present invention according to which p-type sidewall implanted region 370 is formed by conducting both an angled implant 160 (FIG. 14) and a 90 degree implant 260 (FIG. 14) as part of the fabrication of a photodiode 399 (FIG. 16) of a pixel sensor cell 300 (FIG. 16). FIG. 14 corresponds to the structure described above leading to FIG. 5. FIG. 14 differs from FIG. 5, however, in that FIG. 14 also shows a 90 degree implant together with an angled implant. The angled ion implantation 160 and the 90 degree implantation 260 of FIG. 14 may be conducted as described above with reference to the first and second exemplary embodiments, to form p-type sidewall implanted region 370 (FIG. 12) with an implant dose within the range of about $3 \times 10^{11}$ to about $3 \times 10^{13}$ atoms per $cm^2$, more preferably of about $1 \times 10^{12}$ atoms per $cm^2$. If desired, multiple implants may be used to tailor the profile of the p-type sidewall and bottom implanted region 370.

As in the previous embodiment, the sidewall and bottom implanted region 370 is formed adjacent the thin insulating layer 154 of the trench isolation 350 (FIG. 16), providing a link up or a hook up region for the p-type region 124 to the p-type layer 120 and substrate 110 and minimizing the formation of trap sites along the sidewalls 158 and bottom 159.

Figure 1:
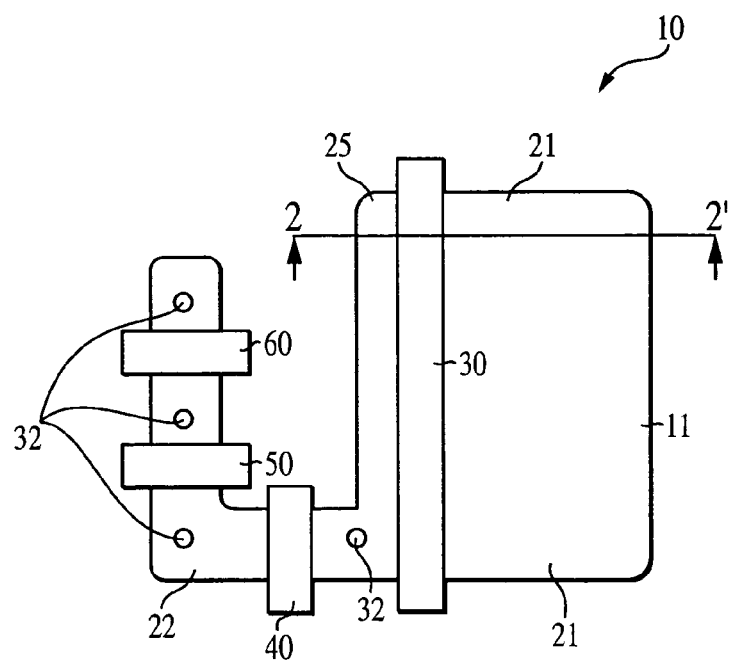
FIG. 1 is a top plan view of an exemplary CMOS image sensor pixel.

After or during the formation of the trench isolation and photodiode regions shown in the embodiments of FIGS. 10, FIG. 13 and FIG. 16, the remaining devices of the pixel sensor cell 100, 200, 300 including the reset transistor, the source follower transistor and row select transistor shown in FIG. 1 as associated with respective gates 40, 50 and 60 and source/drain regions on either sides of the gates, are formed by well-known methods. Conventional processing steps may be also employed to form contacts and wiring to connect gate lines and other connections in the pixel cell 100, 200, 300. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Figure 17:
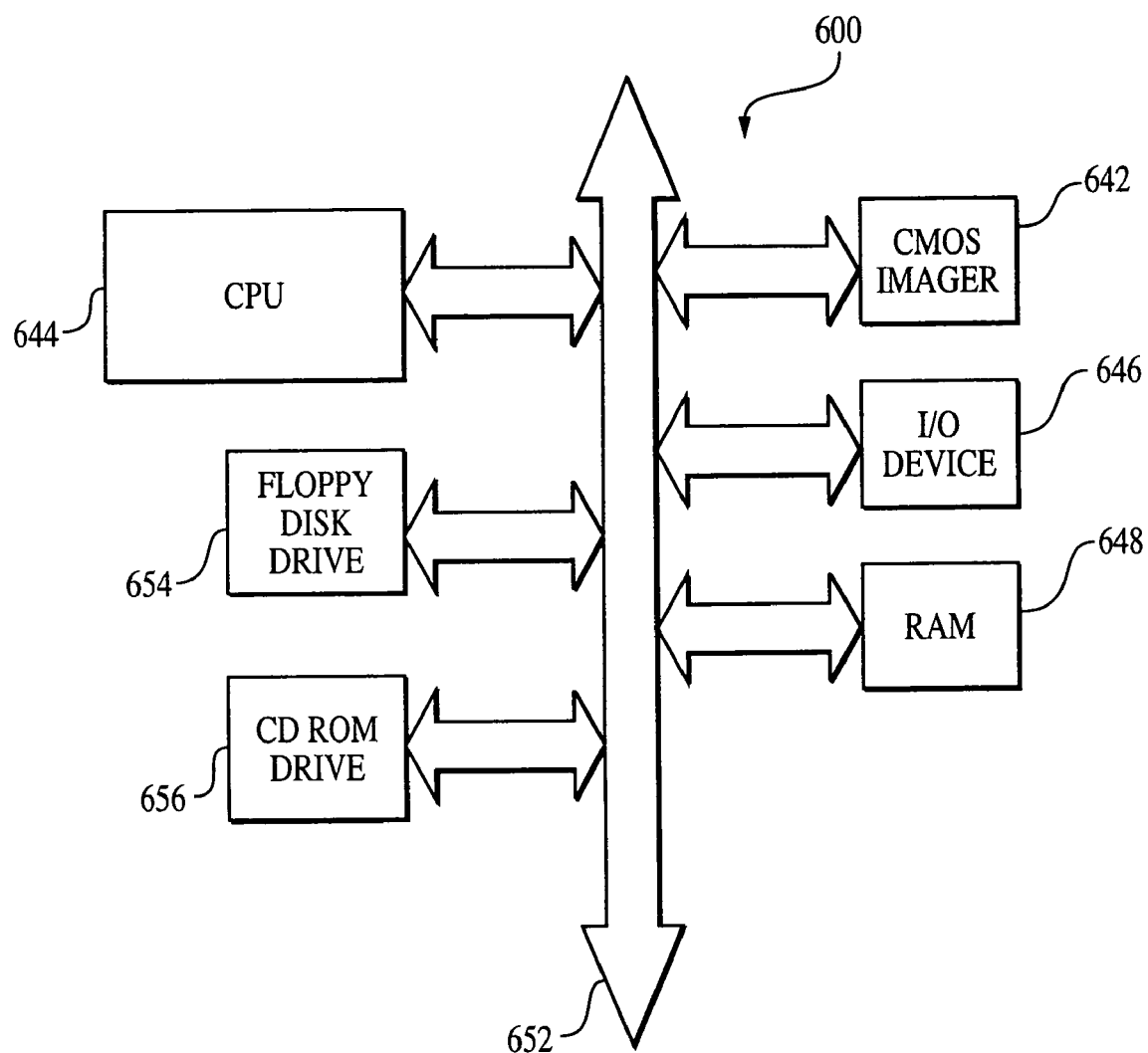
FIG. 17 illustrates a schematic diagram of a computer processor system incorporating a CMOS image sensor fabricated according to the present invention.

A typical processor based system, which includes a CMOS image sensor according to the invention is illustrated generally at 642 in FIG. 17. A processor based system is exemplary of a system having digital circuits which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the above embodiments have been described with reference to the formation of a p-n-p photodiode, such as the p-n-p photodiode 199, 299, 399 (FIGS. 10, 13, 16) having a p-type sidewall and bottom implanted region 170, 270, 370 formed by angled, straight or a combination of angled and straight implantation along the sidewalls and bottom of a trench isolation region, it must be understood that the invention is not limited to this embodiment. Accordingly, the invention has equal applicability to n-p-n photodiodes comprising an n-type sidewall and bottom implanted region formed by angled, straight or a combination of angled and straight implantation along the sidewalls of a shallow trench isolation region. Of course, the dopant and conductivity type of all structures will change accordingly, with the transfer gate corresponding to a PMOS transistor.

In addition, although the invention has been described with reference to the formation of only one trench isolation region 150, the invention also contemplates the formation of a multitude of such trench isolation regions located at various locations on the substrate. Further, and as noted above, although the invention has been described above with reference to a transfer gate of a transfer transistor for use in a four-transistor (4T) pixel cell, the invention also has applicability to a three-transistor (3T) cell or a five-transistor (5T) cell. A 3T cell differs from the 4T cell by the omission of the charge transfer transistor and associated gate, and the coupling of the n regions of the photodiode and the floating diffusion regions through an overlap of the two or an n region bridging the two, which is well known in the art. A 5T cell differs from the 4T cell by the addition of a shutter transistor or a CMOS photogate transistor.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A trench isolation structure, comprising:
   a dielectric material formed within a substrate trench;
   an insulating layer disposed in contact with, and extending along, sidewalls and a bottom of said dielectric material within said trench; and
   an implanted region of dopants of a first conductivity type in contact with sidewalls and a bottom of said insulating layer, said implanted region extending along a whole length of said sidewalls and a whole length of said bottom of said insulating layer, said implanted region being further in contact with a doped region of said first conductivity type of an electrical device.

2. The trench isolation structure of claim 1, wherein said electrical device is a CMOS imager.

3. The trench isolation structure of claim 1, wherein said electrical device is part of a CDD imager.

4. The trench isolation structure of claim 1, wherein said electrical device is a photosensor.

5. The trench isolation structure of claim 4, wherein said photosensor is a photodiode.

6. The trench isolation structure of claim 4, wherein said photosensor is a photoconductor.

7. The trench isolation structure of claim 4, wherein said photosensor is a photogate.

8. The trench isolation structure of claim 1, wherein said implanted region has a thickness of about 10 to about 1,500 Angstroms.

9. The trench isolation structure of claim 1, wherein said implanted region is doped with a p-type dopant at an implant dose of from about $3 \times 10^{11}$ to about $3 \times 10^{13}$ atoms per $cm^2$.

10. The trench isolation structure of claim 9, wherein said implant dose is of about $1 \times 10^{12}$ atoms per $cm^2$.

11. The trench isolation structure of claim 1, wherein said isolation structure is an STI structure.

12. The trench isolation structure of claim 1, wherein said isolation structure is a LOCOS structure.

13. The trench isolation structure of claim 1, wherein said insulating layer has a thickness of about 10 to about 400 Angstroms.

14. The trench isolation structure of claim 1, wherein said dielectric material is a High Density Plasma oxide.

* * * * *